(12) United States Patent
Futami et al.

(10) Patent No.: US 11,591,166 B2
(45) Date of Patent: Feb. 28, 2023

(54) CONVEYOR SYSTEM

(71) Applicant: MURATA MACHINERY, LTD., Kyoto (JP)

(72) Inventors: Takahiko Futami, Ise (JP); Shigeyuki Arai, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 17/288,937

(22) PCT Filed: Sep. 30, 2019

(86) PCT No.: PCT/JP2019/038627
§ 371 (c)(1),
(2) Date: Apr. 27, 2021

(87) PCT Pub. No.: WO2020/090323
PCT Pub. Date: May 7, 2020

(65) Prior Publication Data
US 2021/0380348 A1 Dec. 9, 2021

(30) Foreign Application Priority Data
Nov. 2, 2018 (JP) .............................. JP2018-207432

(51) Int. Cl.
*B65G 43/02* (2006.01)
*B65G 37/02* (2006.01)
(Continued)

(52) U.S. Cl.
CPC ............. *B65G 43/02* (2013.01); *B65G 37/02* (2013.01); *B65G 47/53* (2013.01);
(Continued)

(58) Field of Classification Search
None
See application file for complete search history.

(56) References Cited

U.S. PATENT DOCUMENTS 3,752,339 A * 8/1973 Sullivan ................. B65G 13/10
414/807
7,850,411 B2 * 12/2010 Solomon ................. B65G 1/127
414/277
(Continued)

FOREIGN PATENT DOCUMENTS

| JP | 61-7133 A | 1/1986 |
| WO | 2018114386 A1 | 6/2018 |
| WO | 2018114535 A1 | 6/2018 |

OTHER PUBLICATIONS

Official Communication issued in corresponding European Patent Application No. 19879593.2 dated Jul. 7, 2022.

*Primary Examiner* — Kavel Singh
(74) *Attorney, Agent, or Firm* — Keating & Bennett, LLP

(57) ABSTRACT

A conveyor system includes a first conveyor line to convey an article in a first direction, a second conveyor line parallel or substantially parallel with the first conveyor line to convey the article in a second direction that is a direction opposite to the first direction, a backup line parallel or substantially parallel with the first conveyor line and the second conveyor line and able to change states between a state of conveying the article in the first direction and a state of conveying the article in the second direction, first connecting lines to convey the article between the first conveyor line and the backup line, and second connecting lines to convey the article between the second conveyor line and the backup line.

17 Claims, 11 Drawing Sheets

(51) Int. Cl.
   *B65G 47/53*   (2006.01)
   *B65G 15/06*   (2006.01)
(52) U.S. Cl.
   CPC ............... *B65G 2201/0297* (2013.01); *B65G 2203/0266* (2013.01); *B65G 2207/14* (2013.01)

(56)         References Cited

U.S. PATENT DOCUMENTS

| | | |
|---|---|---|
| 2009/0000908 A1 | 1/2009 | Brian et al. |
| 2016/0300291 A1* | 10/2016 | Carmeli ............. G06Q 30/0635 |
| 2019/0329987 A1 | 10/2019 | Meschenmoser et al. |
| 2019/0382208 A1 | 12/2019 | Meschenmoser et al. |

* cited by examiner

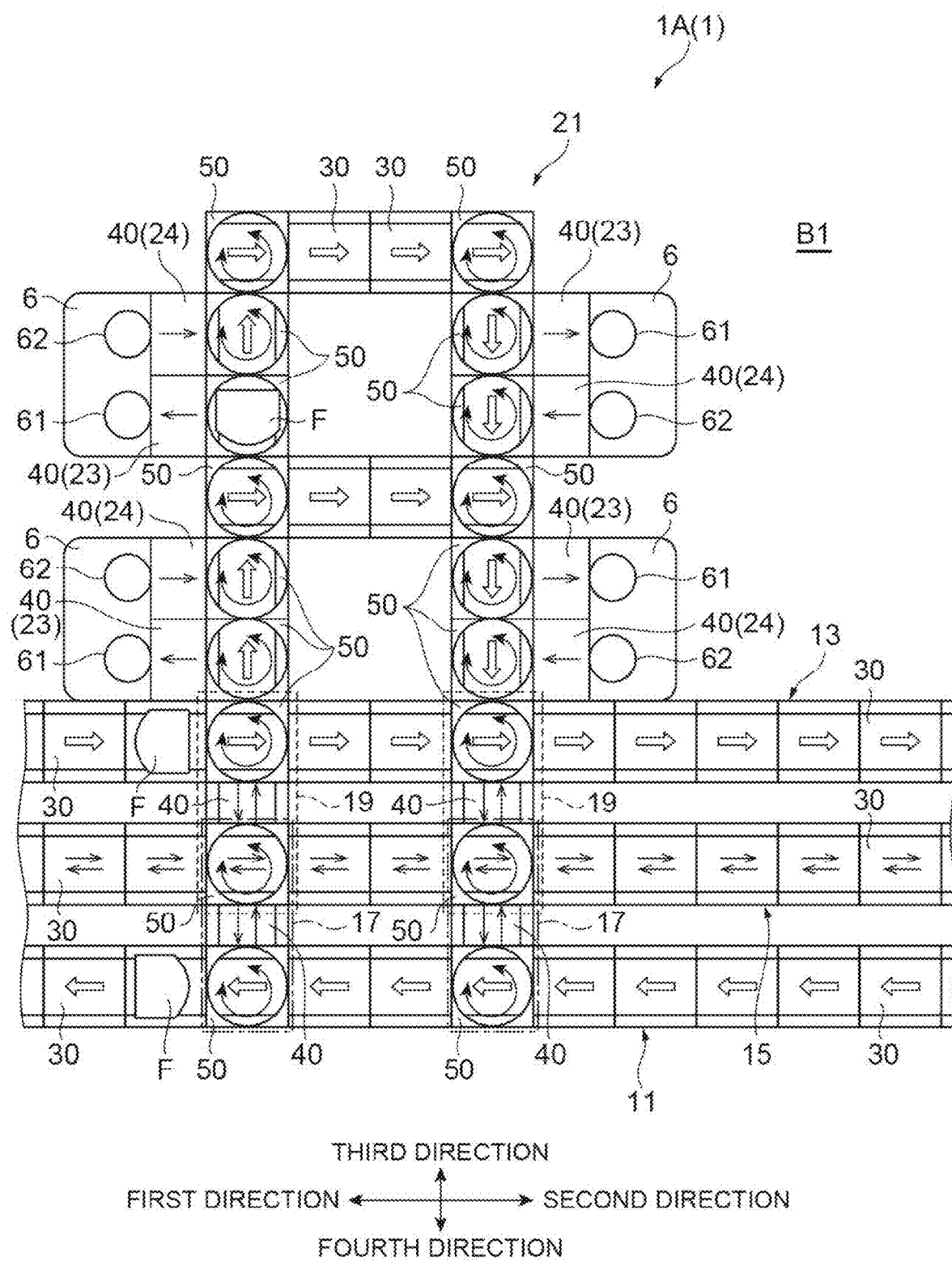

WIDTH DIRECTION

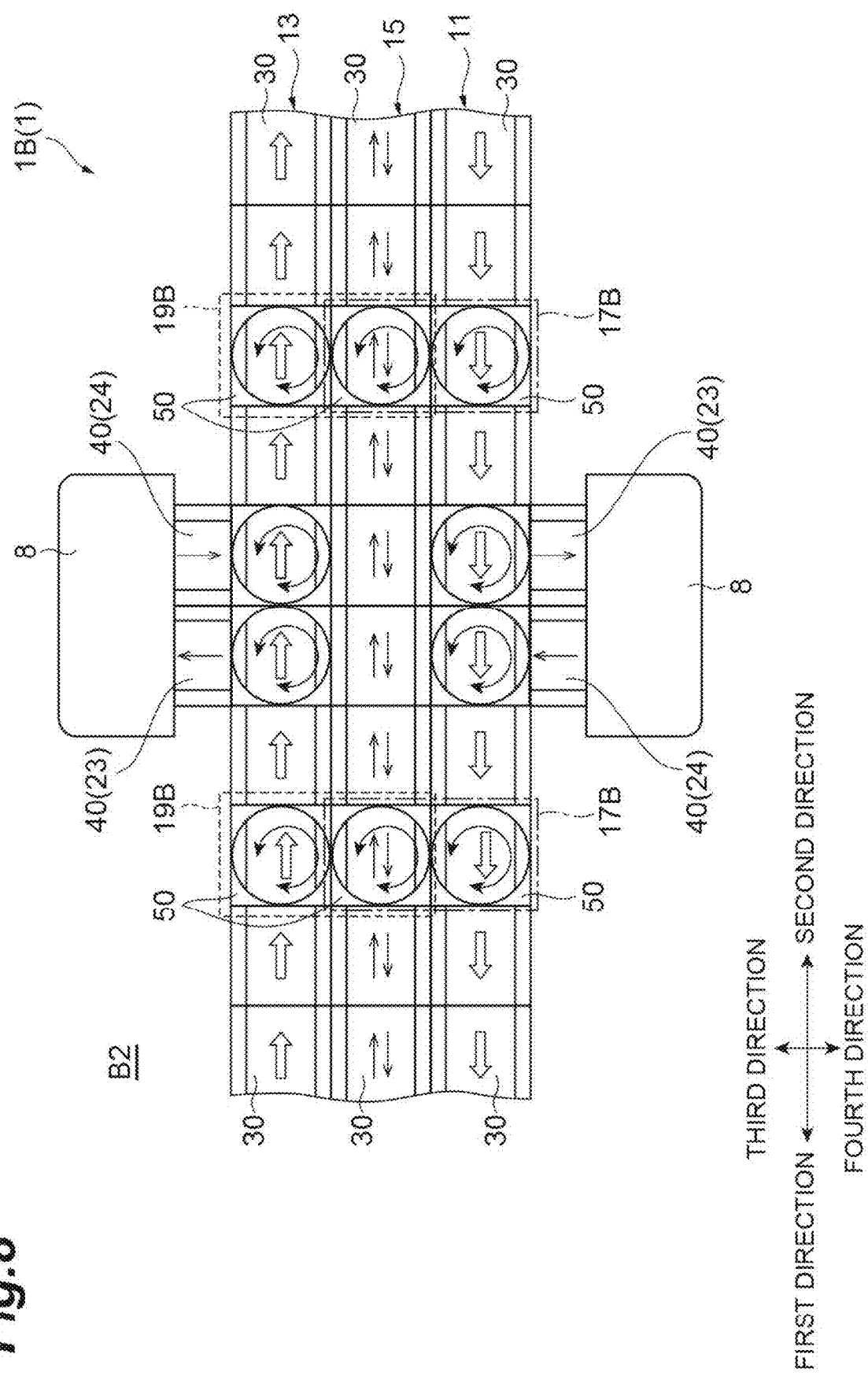

CONVEYOR SYSTEM

BACKGROUND OF THE INVENTION

1. Field of the Invention

The present invention relates to a conveyor system.

2. Description of the Related Art

As a conveyor configured to convey an article, a conveyor device is known. For example, Japanese Unexamined Patent Publication No. S61-7133 discloses a conveyor system in which two conveyor lines configured to convey articles in directions opposite to each other along one direction are disposed in parallel in the width direction of belt conveyors. In this conveyor system, a backup line that can substitutively convey an article, for example, at the time of a failure of a conveyor line or at the time of a maintenance thereof (hereinafter, these are collectively called "abnormal time of the conveyor line") may be desirable. In this case, for example, a backup line may be provided for each of the conveyor lines configured to convey articles in the directions opposite to each other.

However, arranging the backup lines corresponding to the respective two conveyor lines requires a large space for installation. In some cases, a factory, for example, in which the conveyor system is arranged has only a limited space and the two backup lines cannot be arranged.

SUMMARY OF THE INVENTION

Preferred embodiments of the present invention provide conveyor systems in each of which backup lines to substitutively convey articles when abnormalities have occurred in conveyor lines are able to be compactly constructed.

A conveyor system according to a preferred embodiment of the present invention is a conveyor system including conveyor devices to convey an article while supporting a bottom portion of the article. The conveyor system includes a first conveyor line to convey the article in a first direction; a second conveyor line parallel or substantially parallel with the first conveyor line to convey the article in a second direction that is a direction opposite to the first direction; a backup line parallel or substantially parallel with the first conveyor line and the second conveyor line and able to change states between a state of conveying the article in the first direction and a state of conveying the article in the second direction; first connecting lines to convey the article between the first conveyor line and the backup line; and second connecting lines to convey the article between the second conveyor line and the backup line.

In the conveyor system described above, instead of providing backup lines corresponding to the respective ones of the first conveyor line and the second conveyor line, only one backup line shared by the first conveyor line and the second conveyor line is provided. This one backup line is able to convey the article in both directions of the first direction and the second direction. The first connecting lines are able to carry in and carry out the article between the one backup line and the first conveyor line. The second connecting lines are able to carry in and carry out the article between the one backup line and the second conveyor line. Accordingly, the same operation as when backup lines are provided with the respective ones of the first conveyor line and the second conveyor line is able to be implemented by the one backup line. Consequently, the backup line to substitutively convey the article when an abnormality has occurred in the conveyor lines is able to be compactly constructed.

A conveyor system according to a preferred embodiment of the present invention may further include a controller to control the conveyor devices included in each of the first conveyor line, the second conveyor line, the backup line, the first connecting lines, and the second connecting lines; and an abnormal-state detector to determine that an abnormality is present in at least one of the conveyor devices included in each of the first conveyor line and the second conveyor line. the controller may start up at least some of the conveyor devices included in the backup line from a stationary state, and may perform backup control using the first connecting lines, the second connecting lines, and the backup line and to convey the article to detour around the at least one of the conveyor devices experiencing the abnormality, when the abnormal-state detector has determined that the abnormality is present. Accordingly, by using the backup line, the first connecting lines, and the second connecting lines that start up at abnormal time, the article is conveyed to detour around the abnormal location. Consequently, even if an abnormality has occurred in at least one of the first conveyor line and the second conveyor line, conveyance of the article is able to be continued without stopping the conveyance.

In a conveyor system according to a preferred embodiment of the present invention, as the conveyor device, turning conveyor devices to convey the article while supporting a bottom portion of the article and to rotate the article about the vertical direction as a rotation axis may be provided at connecting portions between the first conveyor line and the first connecting lines, connecting portions between the backup line and the first connecting lines, connecting portions between the second conveyor line and the second connecting lines, and connecting portions between the backup line and the second connecting lines. Accordingly, when an article the front-back orientation of which is specified is conveyed, the article is able to be conveyed with the orientation being maintained.

In a conveyor system according to a preferred embodiment of the present invention, the controller may inhibit rotation of the turning conveyor devices provided at connecting portions respectively, when the article is located on one of the conveyor devices provided between two of the connecting portions adjacent to each other. Accordingly, articles are able to be prevented from colliding with each other during the backup control.

In a conveyor system according to a preferred embodiment of the present invention, the controller may search for a shortest path to detour around the at least one of the conveyor devices experiencing an abnormality, and start up only conveyor devices corresponding to the shortest path, among the conveyor devices included in the backup line. Accordingly, the number of conveyor devices to be started up as the backup line is able to be minimized. Furthermore, the distance in a conveyance direction of the backup line to detour around one abnormal location is able to be reduced, and thus the distance in a conveyance direction of a backup line to detour around another abnormal location is able to be longer. Thus, even if an abnormality has occurred in a plurality of locations, the possibility of being able to detour around them at the same time is able to be increased. Consequently, a reduction in operating rate when an abnormality has occurred in at least one of the first conveyor line and the second conveyor line is able to be prevented or reduced.

In a conveyor system according to a preferred embodiment of the present invention, the backup line may be located between the first conveyor line and the second conveyor line in a width direction perpendicular or substantially perpendicular to the first direction. Accordingly, the first connecting lines and the second connecting lines are able to be built simply.

In a conveyor system according to a preferred embodiment of the present invention, the first connecting lines and the second connecting lines may be able to convey the article in both directions of a carry-in direction in which the article is carried into the backup line and a carry-out direction in which the article is carried out from the backup line. Accordingly, to perform the backup control, more detour routes are able to be selected. Consequently, for example, abnormal locations are able to be detoured around along a shorter route.

In a conveyor system according to a preferred embodiment of the present invention, the first conveyor line and the second conveyor line may face an inter-level conveyor to convey an article in the vertical direction, and also may be connected to a loading-and-unloading conveyor of the inter-level conveyor. Providing the inter-level conveyor requires more space, which often restricts a space in which the conveyor device is provided. Accordingly, the backup line is able to be compactly constructed. Thus, even when the inter-level conveyor is provided, the backup line is able to be built.

A conveyor system according to a preferred embodiment of the present invention may be provided between different buildings to connect processing systems provided in the respective different buildings with each other. When the conveyor system is provided between different buildings, the installation distance thereof is a relatively long distance, which increases cost. Accordingly, only one backup line needs to be installed, and thus cost increases are able to be significantly reduced or prevented.

According to preferred embodiments of the present invention, backup lines to substitutively convey articles when an abnormality has occurred in conveyor lines are able to be compactly constructed.

The above and other elements, features, steps, characteristics, and advantages of the present invention will become more apparent from the following detailed description of the preferred embodiments with reference to the attached drawings.

BRIEF DESCRIPTION OF THE DRAWINGS

FIG. 2 is a plan view illustrating a portion of the conveyor system provided in the first building.

FIG. 8 is a plan view illustrating a portion of the conveyor system provided in the second building.

DETAILED DESCRIPTION OF THE PREFERRED EMBODIMENTS

Preferred embodiments according to the present invention will now be described in detail with reference to the drawings. In description of the drawings, like elements are designated by like reference signs, and duplicate description is omitted.

Figure 1:
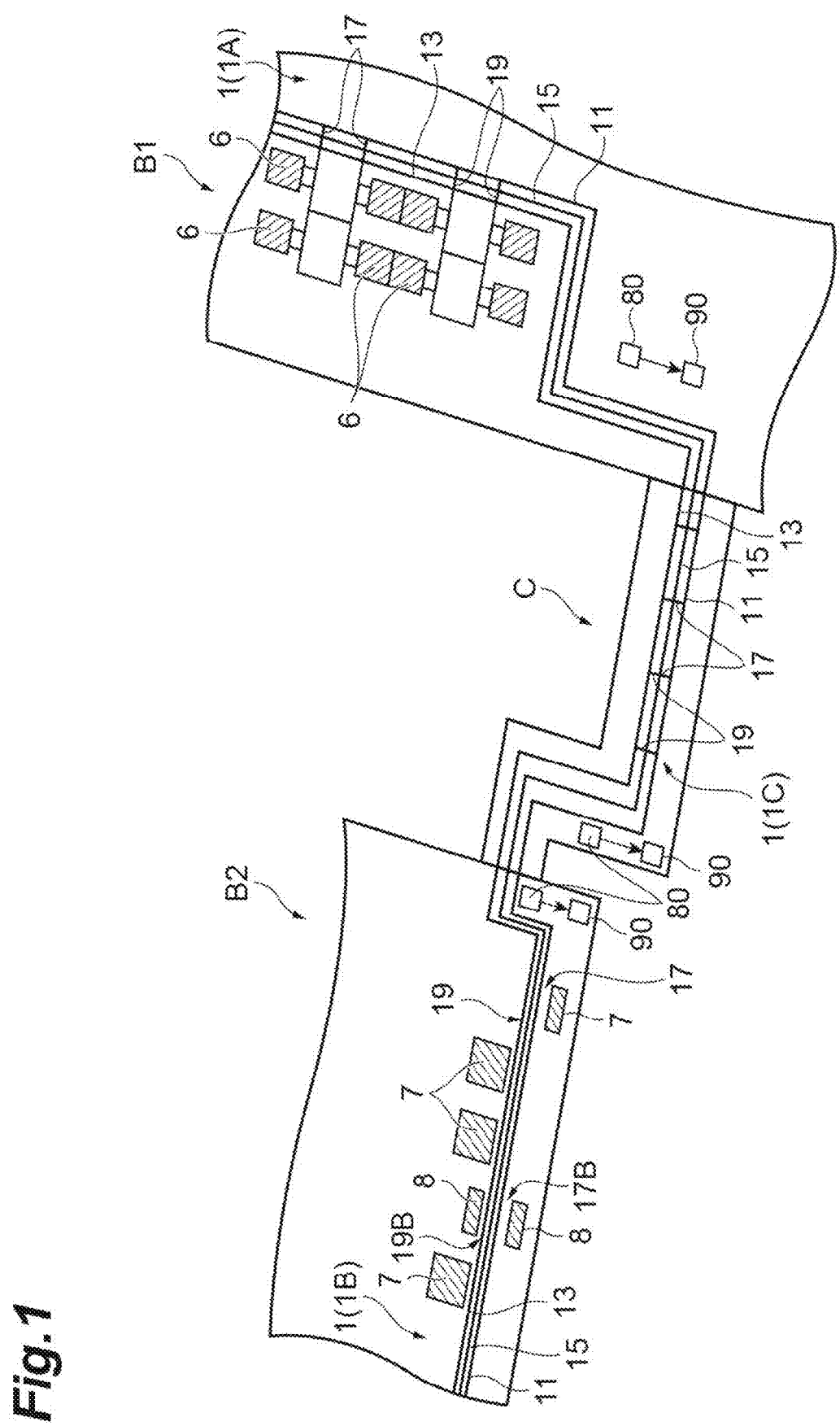
FIG. 1 is a plan view illustrating a first building, a second building, and an inter-building structure in which a conveyor system according to a preferred embodiment of the present invention is provided.

As illustrated in FIG. 1, a conveyor system 1 according to the present preferred embodiment is provided in each of a first building B1, a second building B2, and an inter-building structure C. In the first building B1, a processing system is built, which includes: a plurality of stockers 6 each configured to store a container (hereinafter, called "article F". See FIG. 2) in which an object to be conveyed is stored; and a conveyor system 1A configured to carry an article F into a stocker 6 and carry the article F out from the stocker 6. Examples of the article F include a front-opening unified pod (FOUP) configured to accommodate wafers to be processed in a semiconductor manufacturing device or a liquid crystal manufacturing device, for example, and a reticle pod to accommodate reticles to be used in the semiconductor manufacturing device or the liquid crystal manufacturing device, for example. In the present preferred embodiment, the FOUP will be described as an example.

In the second building B2, a processing system is provided and includes: processing devices 7 each configured or programmed to perform some type of processing on wafers accommodated in an article F; inter-level conveyors 8 each configured to move in the vertical direction and convey an article F to another floor level; and a conveyor system 1B configured to carry an article F into the processing device 7 or the inter-level conveyor 8 or carry the article F out from the processing device 7 or the inter-level conveyor 8 is built. Examples of the processing devices 7 include devices that perform, on wafers, various types of processes, for example, cleaning, ion implantation, thermal treatment, lithography, etching, deposition, and planarization.

The inter-building structure C is provided between the first building B1 and the second building B2. In the inter-building structure C, a conveyor system 1C is provided. The conveyor system 1C is provided between the first building B1 and the second building B2 that are different, and connects the processing systems, each provided in the first building B1 and the second building B2 that are different, with each other.

The following describes the conveyor system 1A provided in the first building B1 in detail. The conveyor system 1A includes, as conveyors 3 to convey an article F while supporting a bottom portion thereof, first conveyors 30 (see FIGS. 3A and 3B), second conveyors 40 (see FIGS. 4A and 4B), and turn conveyors 50 (see FIGS. 5A and 5B). As illustrated in FIG. 2, the conveyor system 1A includes a first conveyor line 11, a second conveyor line 13, a backup line 15, a plurality of first connecting lines 17, a plurality of second connecting lines 19, an article carry-in-and-out line 21, an abnormal-state detector 80 (see FIG. 1), and a controller 90 (see FIG. 1).

The first conveyor line 11 is a portion to convey an article F in a first direction. The first conveyor line 11 includes first conveyors 30 and turn conveyors 50.

Figure 3A:
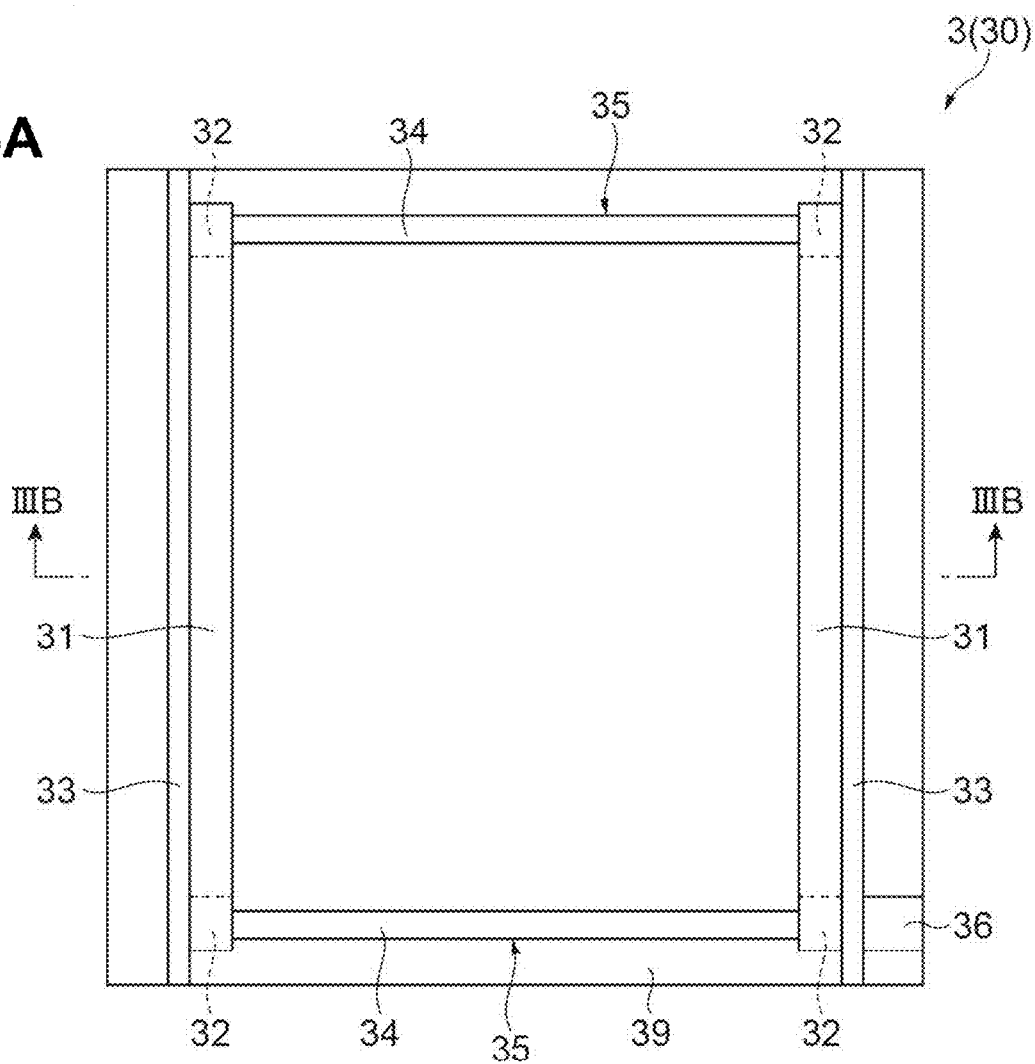
FIG. 3A is a plan view of a first conveyor.
Figure 3B:
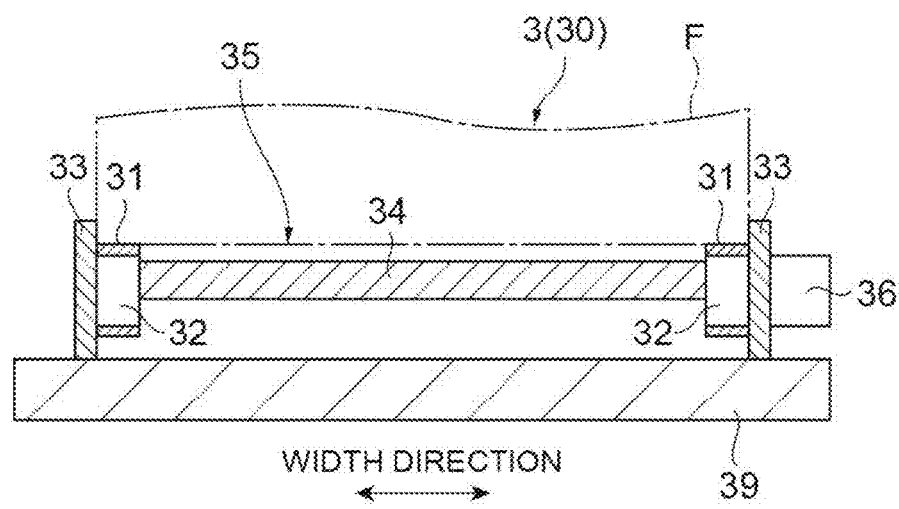
FIG. 3B is a sectional view taken along line IIIB-IIIB in FIG. 3A.

As illustrated in FIGS. 3A and 3B, each first conveyor 30 includes a pair of belts 31, 31 to support both end portions of a bottom portion of an article F in the width direction thereof to convey the article F. The pair of belts 31, 31 are ring-shaped endless belts, and the belts 31, 31 are respectively wound around a pair of conveyor rollers 35, 35 located in the conveyance direction. Each conveyor roller 35 includes roller sections 32 around which the belts 31 are wound and a connecting shaft 34 connecting the roller sections 32, 32 to each other. The respective belts 31, 31 are rotated when at least one of the conveyor rollers 35, 35 is driven by a drive section 36, and convey an article F supported in the first direction. The pair of conveyor rollers 35, are supported by guide sections 33. The guide sections 33 support the pair of conveyor rollers 35, 35 and also guide side surfaces of the article F. The guide sections 33 are supported by a base section 39.

Figure 5A:
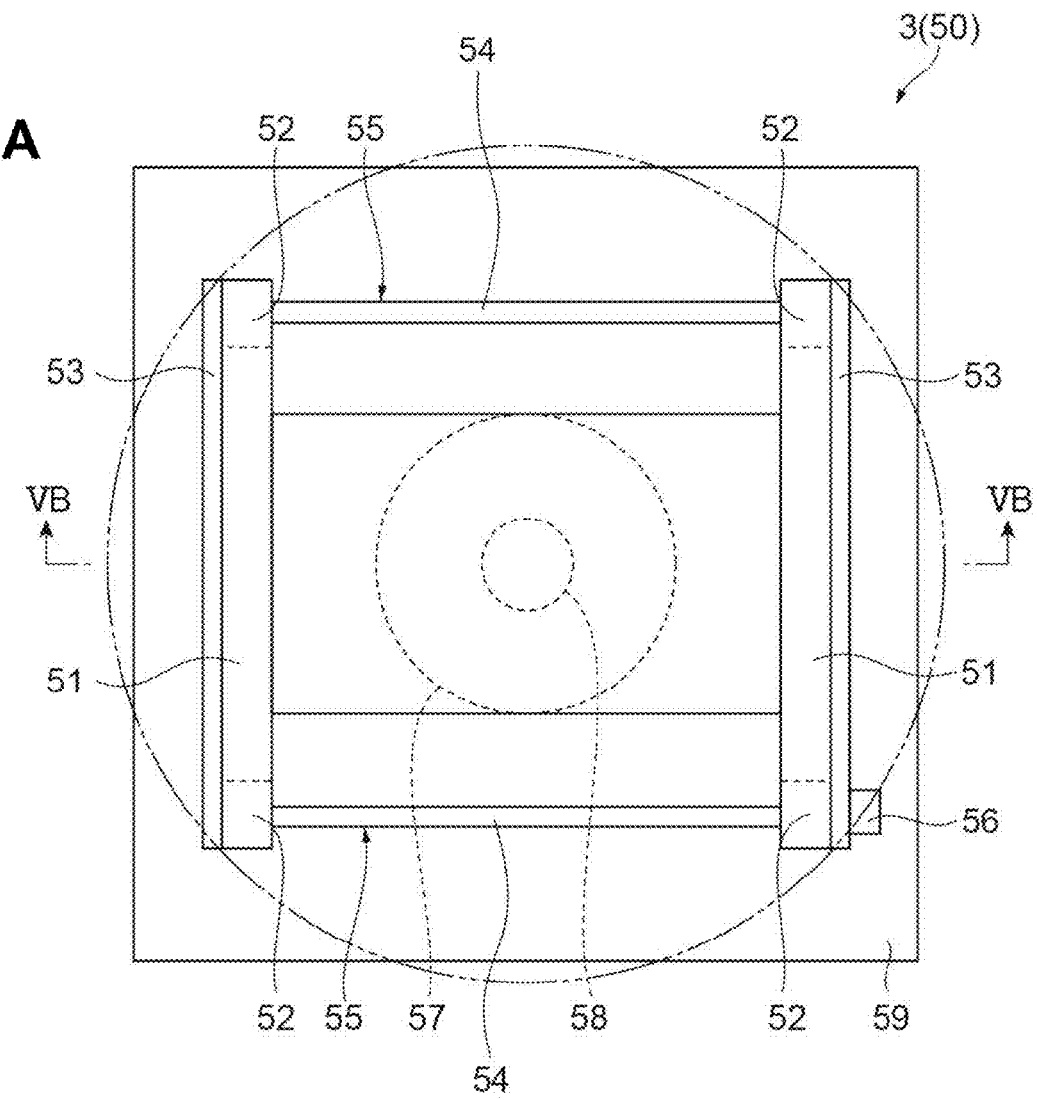
FIG. 5A is a plan view of a turn conveyor.
Figure 5B:
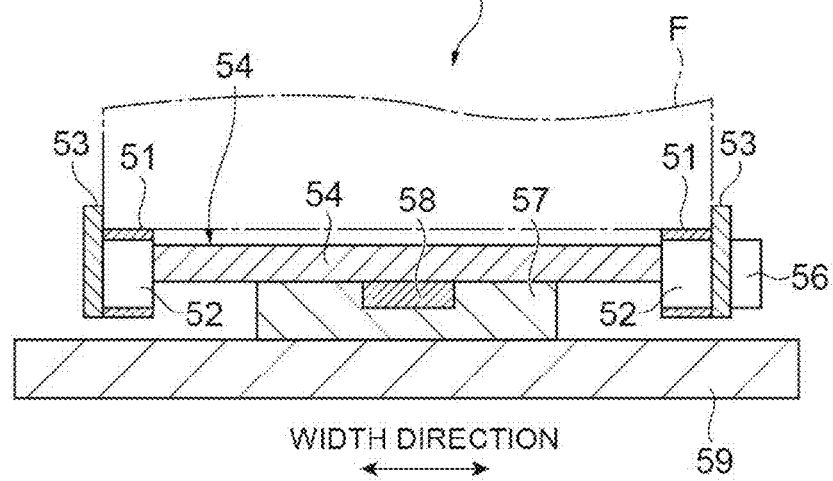
FIG. 5B is a sectional view taken along line VB-VB in FIG. 5A.

As illustrated in FIGS. 5A and 5B, each turn conveyor 50 includes a pair of belts 51, 51 to support both end portions of a bottom portion of an article F in the width direction thereof to convey the article F. The pair of belts 51, 51 are ring-shaped endless belts, and the belts 51, 51 are respectively wound around a pair of conveyor rollers 55, 55 located in the conveyance direction. Each conveyor roller 55 includes roller sections 52 around which the belts 51 are wound and a connecting shaft 54 connecting the roller sections 52, 52 to each other. The respective belts 51, 51 are rotated when at least one of the conveyor rollers 55, 55 is driven by a drive section 56, and convey an article F supported in the first direction.

Guide sections 53 are provided to the pair of conveyor rollers 55, 55. The guide sections 53 guide side surfaces of the article F. The pair of conveyor rollers 55, 55 are supported by a turning section 57. The turning section 57 supports the pair of conveyor rollers 55, 55, and also turns the pair of conveyor rollers 55, 55 to change the traveling direction of the article F. The turning section 57 is rotated by a drive section 58 to turn the pair of conveyor rollers 55, 55 supported. The turning section 57 is supported by a base section 59. In other words, the pair of conveyor rollers 55, 55 supported by the turning section 57 are able to turn with respect to the base section 59.

In the conveyor system 1 according to the present preferred embodiment, as conveyor devices provided in a connecting portion between the first conveyor line 11 and each first connecting line 17, a connecting portion between the backup line 15 and each first connecting line 17, a connecting portion between the second conveyor line 13 and each second connecting line 19, and a connecting portion between the backup line 15 and each second connecting line 19, the above-described turn conveyors 50 are provided. In the conveyor system 1 including the turn conveyors 50 described above, an article F, for example, a FOUP the front-back direction of which is specified, is able be conveyed with the front-back direction being maintained.

As illustrated in FIG. 2, the second conveyor line 13 is a portion that is parallel or substantially parallel with the first conveyor line 11 in a width direction perpendicular or substantially perpendicular to the first direction to convey an article F in a second direction opposite to the first direction.

Similar to the first conveyor line 11, the second conveyor line 13 includes first conveyors 30 and turn conveyors 50. The first conveyors 30 and the turn conveyors 50 used in the second conveyor line 13 are the same as the first conveyors 30 and the turn conveyors 50 included in the first conveyor line 11 except that an article F is conveyed in the second direction. Thus, detailed description of the first conveyors 30 and the turn conveyors 50 is omitted herein.

The backup line 15 is a portion that defines and functions as a backup for the first conveyor line 11 and the second conveyor line 13. The backup line 15 is in a stationary state at a normal time when an abnormality is absent in all of first conveyors 30 and turn conveyors 50 included in the first conveyor line 11 and the second conveyor line 13, and is used as a detour route at a time (hereinafter, simply called "abnormal time") when an abnormality is present in at least one of the first conveyors 30 and the turn conveyor 50 included in the first conveyor line 11 and the second conveyor line 13.

The stationary state herein includes both states of a case in which power is not turned on and a case in which power is turned on but the backup line 15 is not operating.

The backup line 15 is parallel or substantially parallel with the first conveyor line 11 and the second conveyor line 13, and also located between the first conveyor line 11 and the second conveyor line 13 in the width direction of the first conveyor line 11 and the second conveyor line 13. The backup line 15 is able to change states between a state of conveying an article F in the first direction and a state of conveying the article F in the second direction. Similar to the first conveyor line 11, the backup line 15 includes first conveyors 30 and turn conveyors 50. The first conveyors 30 and the turn conveyors 50 used in the backup line 15 are the same as the first conveyors 30 and the turn conveyors 50 included in the first conveyor line 11 except being able to convey the article F in both directions of the first direction and the second direction. Thus, detailed description of the first conveyors 30 and the turn conveyors 50 is omitted herein.

Each first connecting line 17 is a portion to define and function as a backup for the first conveyor line 11 and the second conveyor line 13. The first connecting line 17 conveys an article F between the first conveyor line 11 and the backup line 15. The first connecting line 17 includes a turn conveyor 50 included in the first conveyor line 11, a turn conveyor 50 included in the backup line 15, and a second conveyor 40 provided between these turn conveyors 50, 50.

Figure 4A:
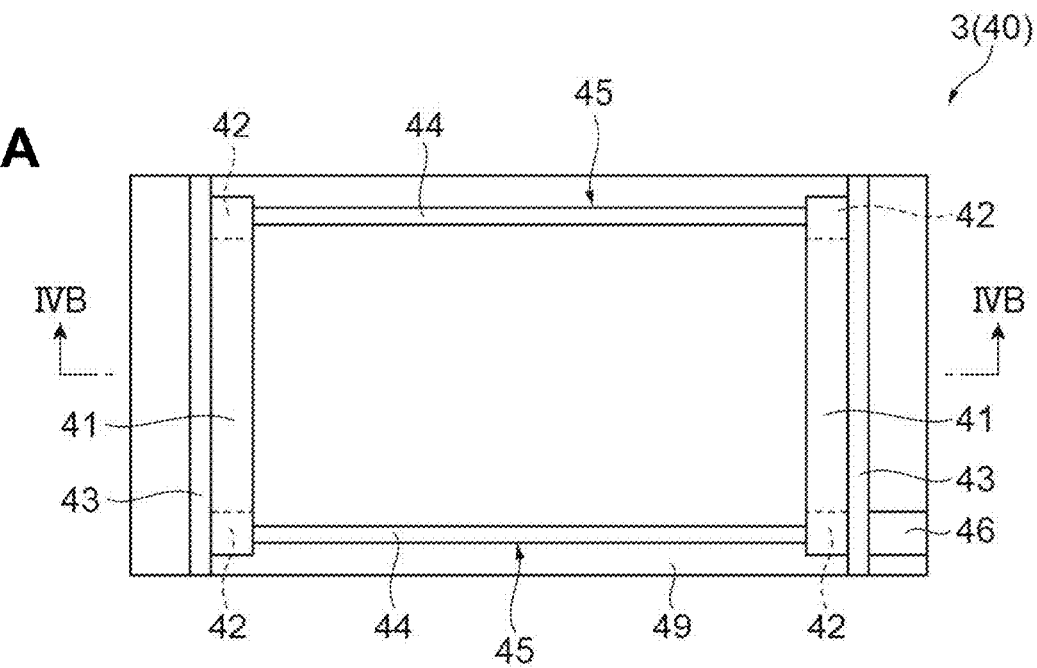
FIG. 4A is a plan view of a second conveyor.
Figure 4B:
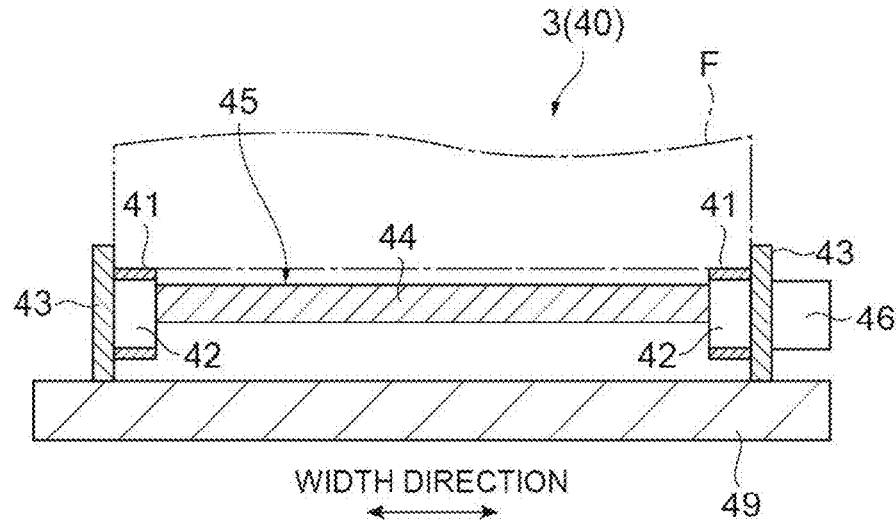
FIG. 4B is a sectional view taken along line IVB-IVB in FIG. 4A.

As illustrated in FIGS. 4A and 4B, each second conveyor 40 includes a pair of belts 41, 41 to support both end portions of a bottom portion of an article F in the width direction thereof to convey the article F. The pair of belts 41, 41 are ring-shaped endless belts, and the belts 41, 41 are respectively wound around a pair of conveyor rollers 45, 45 positioned in the conveyance direction. The distance between the pair of conveyor rollers 45, 45 in the second conveyor 40 is shorter than the distance between the pair of conveyor rollers 35, 35 in each first conveyor 30.

Each conveyor roller 45 includes roller sections 42 around which the belts 41 are wound and a connecting shaft 44 connecting the roller sections 42, 42 to each other. The respective belts 41, 41 are rotated when at least one of the conveyor rollers 45, 45 is driven by a drive section 46, and convey an article F supported in a third direction or a fourth direction perpendicular or substantially perpendicular to the first direction (or the second direction). Specifically, the drive section 46 is able to change rotational directions of the conveyor rollers 45, 45. The pair of conveyor rollers 45, 45 are supported by guide sections 43. The guide sections 43 support the pair of conveyor rollers 45, 45 and also guide side surfaces of the article F. The guide sections 43 are supported by a base section 49.

The turn conveyors 50 used in the first connecting line 17 are the same as the turn conveyors 50 used in the first conveyor line 11 except being able to convey the article F in both directions of the third direction and the fourth direction perpendicular or substantially perpendicular to the first direction (or the second direction). Thus, detailed description of the turn conveyors 50 is omitted herein.

Each second connecting line 19 is a portion to define and function as a backup for the first conveyor line 11 and the second conveyor line 13. The second connecting line 19 conveys an article F between the second conveyor line 13 and the backup line 15. The second connecting line 19 includes a turn conveyor 50 included in the second conveyor line 13, a turn conveyor 50 included in the backup line 15, and a second conveyor 40 provided between these turn conveyors 50, 50. The second conveyor 40 and the turn conveyors 50 used in the second connecting line 19 are the same as the second conveyor 40 and the turn conveyors 50 included in the first connecting line 17. Thus, detailed description of the second conveyor 40 and the turn conveyors 50 is omitted herein.

As illustrated in FIG. 2, the article carry-in-and-out line 21 is a portion to convey an article F between each stocker 6 and the first conveyor line 11 and the second conveyor line 13. The article carry-in-and-out line 21 includes first conveyors 30, second conveyors 40, and turn conveyors 50. The first conveyors 30, the second conveyors 40, and the turn conveyors 50 are the same as the first conveyors 30, the second conveyors 40, and the turn conveyors 50 described above, and thus description thereof is omitted herein.

Each stocker 6 includes a carry-in port 61 to carry an article F therein and a carry-out port 62 to carry the article F out therefrom. Between the carry-in port 61 and the corresponding turn conveyor 50, a second conveyor 40 defining a loading conveyor 23 of the stocker 6 is provided. An article F is oriented toward the second conveyor 40 by turning of the turn conveyor 50, and is sent to the second conveyor 40. Subsequently, the article F is received by a hand device (not illustrated) provided in the carry-in port 61.

Furthermore, between the carry-out port 62 and the corresponding turn conveyor 50, a second conveyor 40 defining an unloading conveyor 24 of the stocker 6 is provided. An article F is passed from the carry-out port 62 to the second conveyor 40 by a hand device (not illustrated) provided in the carry-out port 62. Subsequently, the article F is sent to the turn conveyor 50, and is conveyed downstream by turning of the turn conveyor 50.

The abnormal-state detector 80 (see FIG. 1) is configured to determine that an abnormality is present in at least one of the first conveyors 30 and the turn conveyors 50 included in the first conveyor line 11 and the second conveyor line 13. The abnormal-state detector 80 detects that an abnormality is present in at least one of the first conveyors 30 and the turn conveyors 50 described above, or that at least one thereof has an abnormality is input to the abnormal-state detector 80. For example, the abnormal-state detector 80 may be a detector (not illustrated) such as a sensor to detect an article F placed on each conveyor 3. Alternatively, when a detector is provided in each conveyor 3, the abnormal-state detector 80 may, if a state in which an article F has been detected by one detector has continued for a predetermined period of time or longer, to determine the above-described abnormality by detecting that the article F is not moving on or from the conveyor corresponding to the one detector (detecting that the conveyor 3 is stationary). Alternatively, for example, the abnormal-state detector 80 may receive an input identifying a conveyor experiencing an abnormality via, for example, an interface such as a touch panel by an operator or the like who operates the conveyor system 1A.

The controller 90 controls operation of the conveyor system 1A provided in the first building B1. The controller 90 is an electronic controller including a central processing unit (CPU), a read only memory (ROM), and a random access memory (RAM). The controller 90 may be implemented as, for example, a software program stored in the ROM and loaded into the RAM to be executed by the CPU. The controller 90 may be hardware, for example, an electronic circuit.

For example, an abnormality present in a first conveyor 30 included in the first conveyor line 11 and the second conveyor line 13 has been detected by or input to the abnormal-state detector 80, the controller 90 starts up at least some of the first conveyors 30 and the turn conveyors 50 included in the backup line 15 that is stationary at the normal time from the stationary state, and also performs backup control of using the first connecting line 17, the second connecting line 19, and the backup line 15 and conveying an article F to detour around the first conveyor 30 experiencing an abnormality. The controller 90 retrieves the shortest path to detour around the first conveyor 30 experiencing an abnormality, and starts up, among the first conveyors 30, the second conveyors 40 and the turn conveyors 50 included in the backup line 15, the first connecting lines 17, and the second connecting lines 19, only first conveyors 30 and turn conveyors 50 corresponding to the shortest path. The following describes the backup control of the controller 90 in detail with reference to FIGS. 6A to 6D and FIGS. 7A to 7D.

Figure 6A:
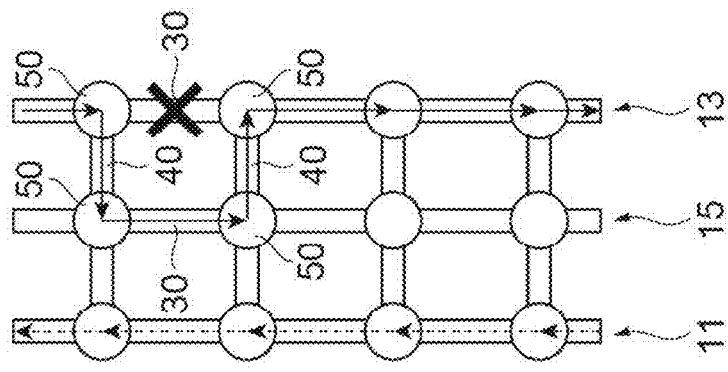
FIGS. 6A to 6D are diagrams each illustrating one example of backup control when an abnormality has occurred in a first conveyor line or a second conveyor line.
Figure 6B:
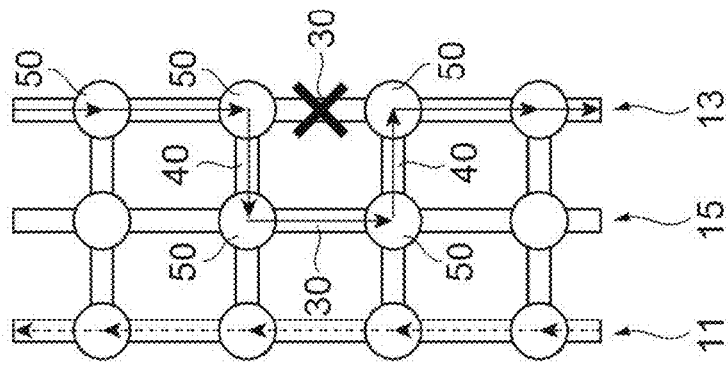

As illustrated in FIGS. 6A and 6B, when an abnormality that has occurred in one of the first conveyors 30 included in the first conveyor line 11 (at the locations of x shown in FIGS. 6A and 6B) has been detected by (or input to) the abnormal-state detector 80, the controller 90 retrieves the shortest route along which the first conveyor 30 experiencing an abnormality is able to be detoured around. Specifically, the controller 90 extracts conveyors 3, 3 included in the first connecting lines 17 or the second connecting lines 19 that are located at both ends of the first conveyor 30 (a node portion described later) experiencing an abnormality, that is, extracts the turn conveyors 50, 50 (link portions described later), and retrieves a detour route the starting point and the ending point of which are the turn conveyors 50, 50.

The controller 90 determines a detour route using the turn conveyors 50, 50 provided at both ends of the first conveyor 30 experiencing an abnormality and included in the first conveyor line 11 and the first connecting lines 17, second conveyors 40, 40 connected to the respective turn conveyors 50, 50 and included in the first connecting lines 17, turn conveyors 50, 50 connected to these respective second conveyors 40, 40 and included in the first connecting lines 17 and the backup line 15, and a first conveyor 30 provided between these turn conveyors 50, 50 and included in the backup line 15. The controller 90 starts up, from the stationary state, the first conveyor 30 and the two turn conveyors 50, 50 on the backup line 15 and the two second conveyors 40, 40 that are in the stationary state and included in this detour route. The controller 90 then causes an article F to be conveyed using the determined detour route to detour around the first conveyor 30 experiencing an abnormality.

Figure 6C:
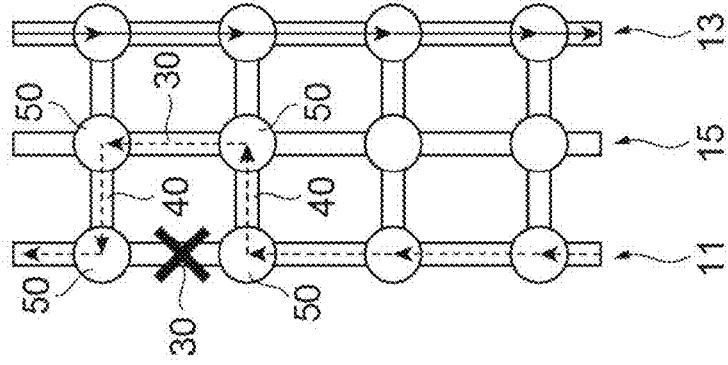
Figure 6D:
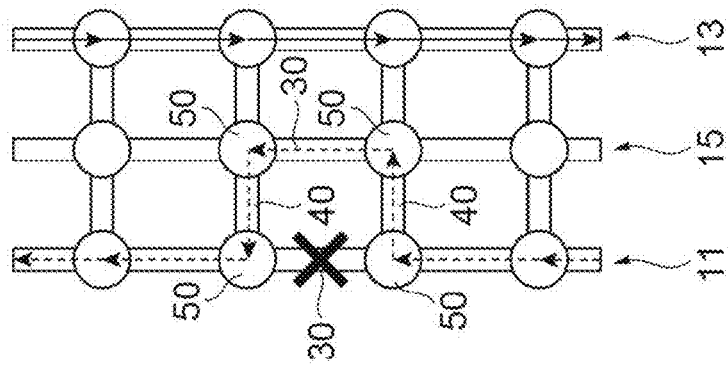

As illustrated in FIGS. 6C and 6D, an abnormality that has occurred in one of the first conveyors 30 included in the second conveyor line 13 (at the locations of x shown in FIGS. 6C and 6D) has been detected by (or input to) the abnormal-state detector 80, the controller 90 retrieves the shortest route along which the first conveyor 30 experiencing an abnormality is able to be detoured around. Herein, the method of determining a detour route is the same as described above.

The controller 90 determines a detour route using turn conveyors 50, 50 provided at both ends of the first conveyor 30 experiencing an abnormality and included in the second conveyor line 13 and the second connecting lines 19, second conveyors 40, 40 connected to the respective turn conveyors 50, 50 and included in the second connecting lines 19, turn conveyors 50, 50 connected to these respective second conveyors 40, 40 and included in the second connecting lines 19 and the backup line 15, and a first conveyor 30 provided between these turn conveyors 50, 50 and included in the backup line 15. The controller 90 starts up, from the stationary state, the first conveyor 30 and the two turn conveyors 50, 50 on the backup line 15 and the two second conveyors 40, 40 that are in the stationary state and included in the detour route. The controller 90 then causes an article F to be conveyed using the determined detour route to detour around the first conveyor 30 experiencing an abnormality.

The following describes a case with reference to FIGS. 7A to 7D in which an abnormality that has occurred in both of a first conveyor 30 included in the first conveyor line 11 and a first conveyor 30 included in the second conveyor line 13 has been detected by (or input to) the abnormal-state detector 80.

As illustrated in FIGS. 7A to 7D, an abnormality that has occurred in one of the first conveyors 30 included in the first conveyor line 11 (at the locations of x shown in FIGS. 7A to 7D) has been detected by (or input to) the abnormal-state detector 80, the controller 90 retrieves the shortest route along which the first conveyor 30 experiencing an abnormality is able to be detoured around. Herein, the method of determining a detour route is the same as described above.

Specifically, the controller 90 determines a detour route using turn conveyors 50, 50 provided at both ends of the first conveyor 30 experiencing an abnormality and included in the first conveyor line 11 and the first connecting lines 17, second conveyors 40, 40 being adjacent to the respective turn conveyors 50, 50 and included in the first connecting lines 17, turn conveyors 50, 50 connected to these respective second conveyors 40, 40 and included in the first connecting lines 17 and the backup line 15, and a first conveyor 30 provided between these turn conveyors 50, 50 and included in the backup line 15. The controller 90 starts up, from the stationary state, the first conveyor 30 and the two turn conveyors 50, 50 on the backup line 15 and the two second conveyors 40, 40 that are in the stationary state and included in the detour route. The controller 90 then causes an article F to be conveyed using the determined detour route to detour around the first conveyor 30 experiencing an abnormality.

When an abnormality that has occurred in one of the first conveyors 30 included in the second conveyor line 13 has been detected by the abnormal-state detector 80, the controller 90 retrieves the shortest route along which the first conveyor 30 experiencing an abnormality is able to be detoured around. Herein, the method of determining a detour route is the same as described above.

Specifically, the controller 90 determines a detour route using turn conveyors 50, 50 provided at both ends of the first conveyor 30 experiencing an abnormality and included in the second conveyor line 13 and the second connecting lines 19, second conveyors 40, 40 connected to the respective turn conveyors 50, 50 and included in the second connecting lines 19, turn conveyors 50, connected to these respective second conveyors 40, 40 and included in the second connecting lines 19 and the backup line 15, and a first conveyor 30 provided between these turn conveyors 50, 50 and included in the backup line 15. The controller 90 starts up, from the stationary state, the first conveyor 30, the two second conveyors 40, 40 and the two turn conveyors 50, 50 on the backup line 15 that are in the stationary state and included in this detour route. The controller 90 then causes an article F to be conveyed using the determined detour route to detour around the first conveyor 30 experiencing an abnormality.

Figure 7A:
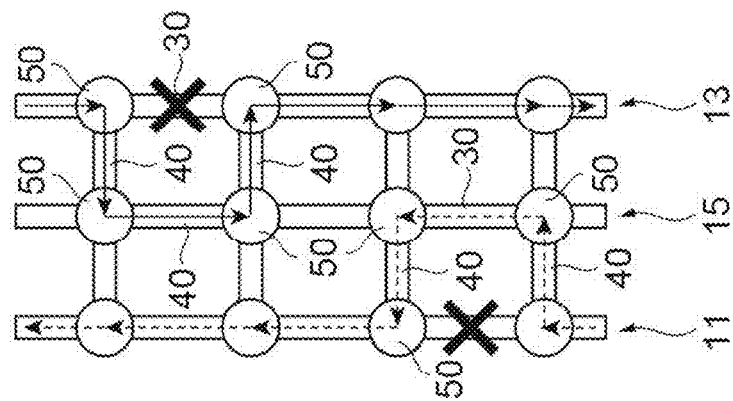
FIGS. 7A to 7D are diagrams each illustrating one example of the backup control when an abnormality has occurred in both the first conveyor line and the second conveyor line.

In the example illustrated in FIG. 7A, a portion of the detour route for the first conveyor line 11 and a portion of the detour route for the second conveyor line 13 overlap each other in one first conveyor 30 and two turn conveyors 50, 50 included in the backup line 15 (the hatched area shown in FIG. 7A). Hereinafter, the connecting portion between the first conveyor line 11 and each first connecting line 17, the connecting portion between the backup line 15 and each first connecting line 17, the connecting portion between the second conveyor line 13 and each second connecting line 19, and the connecting portion between the backup line 15 and each second connecting line 19 will be described each as a link portion, and a portion provided between link portions adjacent to each other will be described as a node portion.

If the detour routes for the first conveyor line 11 and the second conveyor line 13 overlap each other, there is a situation in which articles F collide with each other. In view of this, when an article F is located on a node portion, the controller 90 inhibits rotation of turn conveyors 50, 50 located in link portions at both ends of this node portion. More specifically, the controller 90 inhibits rotation of the turn conveyors 50, 50 other than rotation that allows entry to the turn conveyors 50, 50 from the node portion provided between the turn conveyors 50, 50. This eliminates the possibility that two or more articles F are carried into the same node portion. Consequently, even when the backup control is performed by the controller 90, articles F, F will not collide with each other.

Figure 7B:
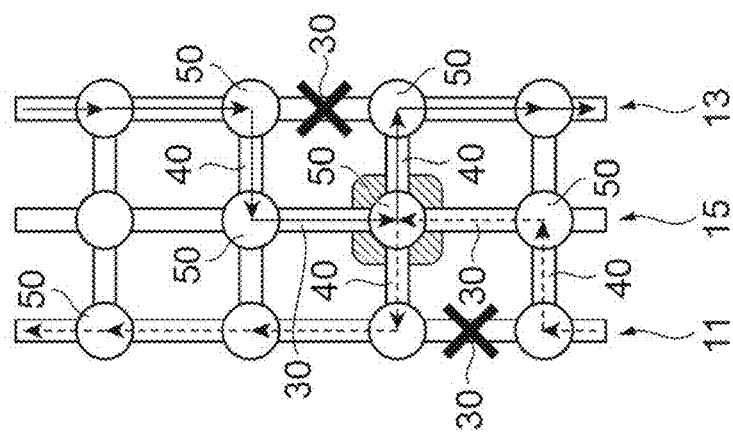
Figure 7C:
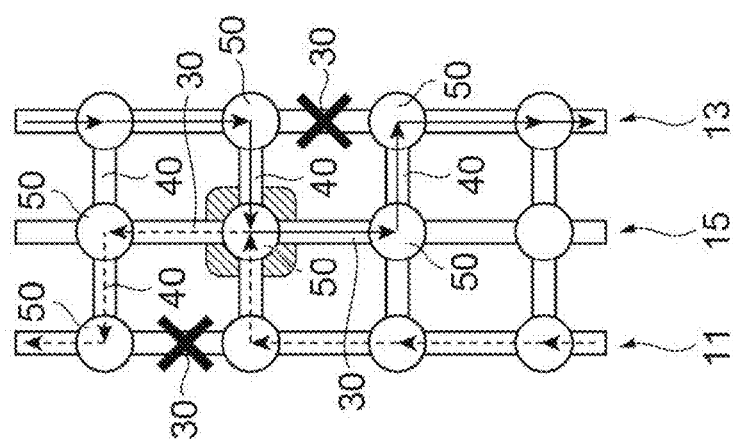

In the examples illustrated in FIGS. 7B and 7C, a portion of the detour route for the first conveyor line 11 and a portion of the detour route for the second conveyor line 13 overlap each other in one turn conveyor 50 included in the backup line 15 (the hatched areas shown in FIGS. 7B and 7C). In this case also, when an article F is located on a node portion, the controller 90 inhibits rotation of turn conveyors 50, 50 located in link portions at both ends of this node portion. More specifically, the controller 90 inhibits rotation of the turn conveyors 50, 50 other than rotation that allows entry to the turn conveyors 50, 50 from the node portion provided between the turn conveyors 50, 50.

Figure 7D:
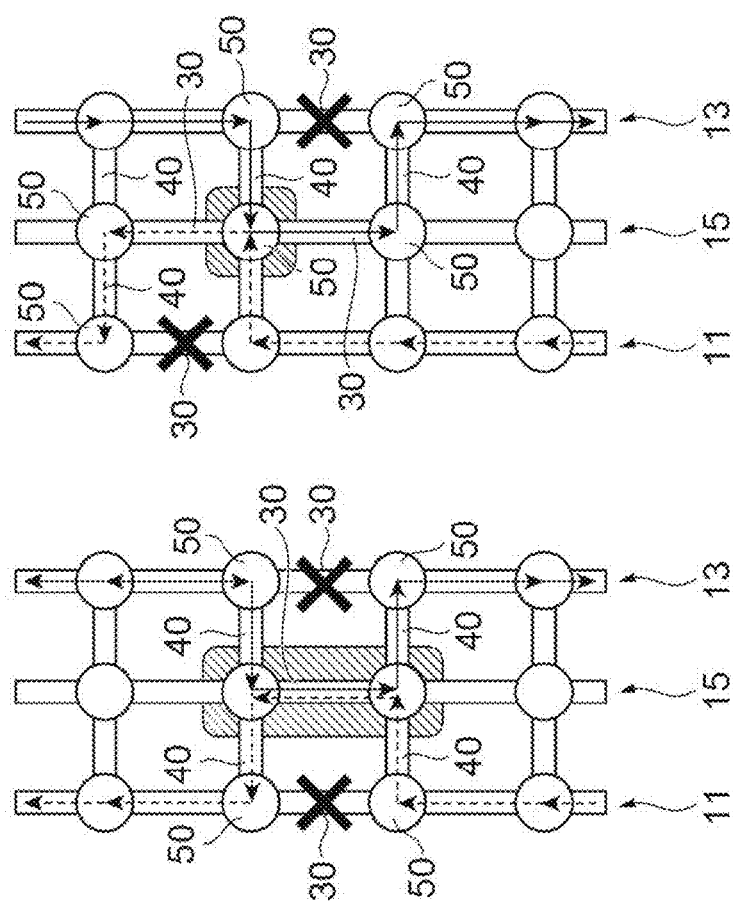

In the example illustrated in FIG. 7D, a portion of the detour route for the first conveyor line 11 and a portion of the detour route for the second conveyor line 13 do not overlap each other in a first conveyor 30 or a turn conveyor 50 included in the backup line 15. Thus, even when the backup control is performed by the controller 90, articles F, F will not collide with each other. In other words, detour operation for the first conveyor line 11 and detour operation for the second conveyor line 13 are able to be processed in parallel. Even in this case, when an article F is located in a node portion, the controller 90 may inhibit rotation of turn conveyors 50, 50 located in link portions at both ends of this node portion.

The following describes the conveyor system 1B provided in the second building B2 in detail. Similarly to the conveyor system 1A, the conveyor system 1B also includes, as conveyors 3 to convey an article F while supporting a bottom portion thereof, first conveyors 30 (see FIGS. 3A and 3B), second conveyors 40 (see FIGS. 4A and 4B), and turn conveyors 50 (see FIGS. 5A and 5B). As illustrated in FIG. 8, the conveyor system 1B includes the first conveyor line 11, the second conveyor line 13, the backup line 15, a plurality of first connecting lines 17B, a plurality of second connecting lines 19B, an abnormal-state detector 80 (see FIG. 1), and a controller 90 (see FIG. 1).

The conveyor system 1B is different from the conveyor system 1A in the first connecting lines 17B to convey an article F between the first conveyor line 11 and the backup line 15, in the second connecting lines 19B to convey an article F between the second conveyor line 13 and the backup line 15, and in that the article carry-in-and-out line 21 provided on the conveyor system 1A is omitted. Specifically, as illustrated in FIG. 8, between the first conveyor line 11 and the backup line 15 and between the second conveyor line 13 and the backup line 15, the second conveyors 40 are not provided. In other words, each first connecting line 17B is includes only a turn conveyor 50 included in the first conveyor line 11 and a turn conveyor 50 included in the backup line 15, and an article F is passed directly between these turn conveyors 50. Each second connecting line 19B includes only a turn conveyor 50 included in the second conveyor line 13 and a turn conveyor 50 included in the backup line 15.

In the conveyor system 1B, each of the first conveyor line 11 and the second conveyor line 13 face the corresponding inter-level conveyor 8 to convey an article in the vertical direction. Specifically, to turn conveyors 50 included in the first conveyor line 11, second conveyors 40, 40 defining respective loading-and-unloading conveyors (a loading conveyor 23 and an unloading conveyor 24) of an inter-level conveyor 8 are connected. Herein, the backup line 15 does not face the inter-level conveyor (is not connected directly thereto). The features other than those described above are the same as those of the conveyor system 1A, and thus detailed description is omitted herein.

Backup control performed by the controller 90 of the conveyor system 1B is the same as the backup control performed by the controller 90 of the conveyor system 1A described above except that the second conveyors 40 included in the first connecting line 17 and the second connecting line 19 are not involved. Thus, even if an abnormality has occurred in a first conveyor 30 and a turn conveyor 50 in portions of the first conveyor line 11 and the second conveyor line 13 in conveyor system 1B, an article F is able to be conveyed while detouring around the first conveyor 30 and the turn conveyor 50 in which the abnormality has occurred.

The following describes the conveyor system 1C provided in the inter-building structure C in detail. Similarly to the conveyor system 1A, the conveyor system 1C also includes, as conveyors 3 to convey an article F while supporting a bottom portion thereof, first conveyors 30 (see FIGS. 3A and 3B), second conveyors (see FIGS. 4A and 4B), and turn conveyors 50 (see FIGS. 5A and 5B).

Figure 9:
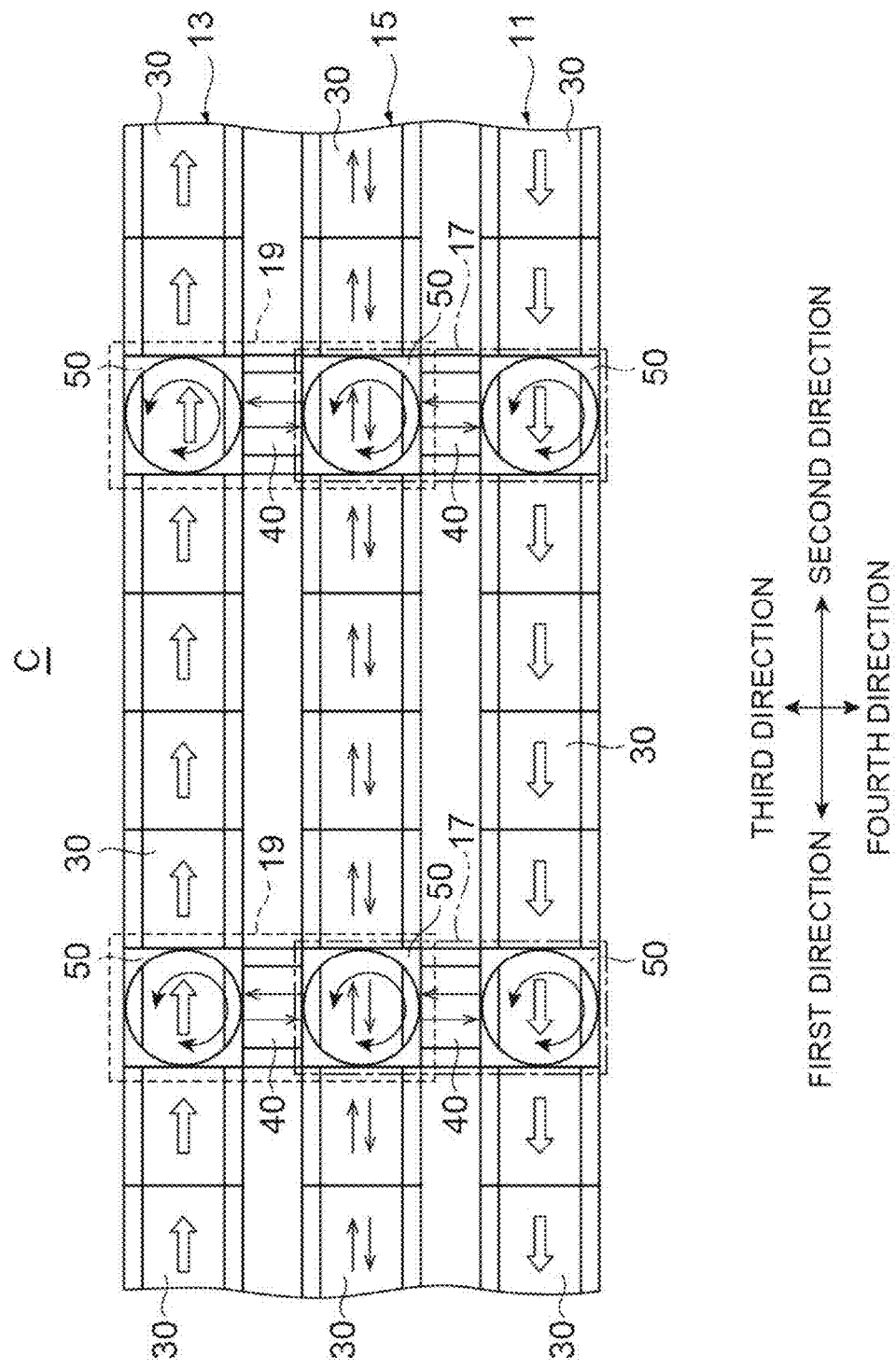
FIG. 9 is a plan view illustrating a portion of the conveyor system provided in the inter-building structure.

As illustrated in FIG. 9, the conveyor system 1C includes the first conveyor line 11, the second conveyor line 13, the backup line 15, a plurality of first connecting lines 17, a plurality of second connecting lines 19, an abnormal-state detector 80 (see FIG. 1), and a controller 90 (see FIG. 1). The conveyor system 1C is provided between different buildings (the first building B1 and the second building B2) to connect the processing systems each provided in the different buildings (the first building B1 and the second building B2) with each other.

The conveyor system 1C is different from the conveyor system 1A in that the intervals where the first connecting lines 17 and the second connecting lines 19 are located in the conveyance direction (the first direction and the second direction) are longer than those in the conveyor system 1A as illustrated in FIG. 8 and in that the article carry-in-and-out line 21 provided on the conveyor system 1A is not provided. The features other than those described above are the same as those of the conveyor system 1A, and thus detailed description is omitted herein.

Backup control performed by the controller 90 of the conveyor system 1C also is the same as the backup control performed by the controller 90 of the conveyor system 1A described above. Thus, even if an abnormality has occurred in a first conveyor 30 and a turn conveyor 50 in portions of the first conveyor line 11 and the second conveyor line 13 in the conveyor system 1C, an article F is able to be conveyed while detouring around the first conveyor 30 and the turn conveyor 50 in which the abnormality has occurred.

The following describes functional effects of the conveyor system 1 according to the preferred embodiment described above. In the conveyor system 1 according to the preferred embodiment described above, instead of providing backup lines corresponding to the respective ones of the first conveyor line 11 and the second conveyor line 13, only one backup line 15 shared by the first conveyor line 11 and the second conveyor line 13 is provided. The first connecting lines 17 carry in and carry out the article between the one backup line 15 and the first conveyor line 11. The second connecting lines 19 carry in and carry out the article between the one backup line 15 and the second conveyor line 13. Accordingly, the same operation as when backup lines are provided with the respective ones of the first conveyor line 11 and the second conveyor line 13 is able to be implemented by the one backup line 15. Consequently, the backup line 15 configured to substitutively convey an article F when an abnormality has occurred in the first conveyor line 11 and the second conveyor line 13 is able to be compactly constructed.

In the conveyor system 1 according to the preferred embodiment described above, first conveyors 30 and turn conveyors 50 that are in the stationary state at the normal time and included in the backup line 15 automatically start up at abnormal time. Specifically, at abnormal time, the backup line 15, the first connecting lines 17, and the second connecting lines 19 automatically start up. Accordingly, article conveyance is able to be performed by the backup line 15, the first connecting lines 17, and the second connecting lines 19 while detouring around abnormal locations. Consequently, even if an abnormality has occurred in at least one of the first conveyor line 11 and the second conveyor line 13, conveyance of an article F is able to be continued without stopping the conveyance.

In the conveyor system 1 according to the preferred embodiment described above, conveyors 3 provided in link portions are turn conveyors 50 to convey an article F while supporting a bottom portion thereof and also rotate the article F about the vertical direction as a rotation axis. Accordingly, when an article F, for example, a FOUP the front-back orientation of which is specified is conveyed, the article F is able to be conveyed with the orientation being maintained.

In the conveyor system 1 according to the preferred embodiment described above, when an article F is located in a node portion, each controller 90 inhibits rotation of turn conveyors 50 in link portions at both ends of this node portion. By this control, articles F, F are able to be prevented from colliding with each other during the backup control performed by the controller 90.

In the conveyor system 1 according to the preferred embodiment described above, the controller 90 retrieves the shortest path to detour around a first conveyor 30 experiencing an abnormality in the first conveyor line 11 and the second conveyor line 13, and starts up, among conveyors 3 (first conveyors 30 and turn conveyors 50) included in the backup line 15, only first conveyors 30 and turn conveyors 50 corresponding to the shortest path. By this control, the number of first conveyors 30 and turn conveyors 50 to be started up as the backup line 15 is able to be reduced or minimized. Furthermore, in the preferred embodiment described above, the distance in the conveyance direction of the backup line 15 to detour one abnormal location is able to be reduced. Thus, even if an abnormality has occurred in a plurality of locations, the possibility of being able to detour around them at the same time is able to be increased. Consequently, reduction in operating rate when an abnormality has occurred in at least one of the first conveyor line 11 and the second conveyor line 13 is able to be prevented or reduced.

In the conveyor system 1 according to the preferred embodiment described above, the backup line 15 is provided between the first conveyor line 11 and the second conveyor line 13 in the width direction, and thus the first connecting lines 17 and the second connecting lines 19 are able to be built simply.

In the conveyor system 1 according to the preferred embodiment described above, each first connecting line 17 and each second connecting line 19 are able to convey an article F in both directions of the third direction and the fourth direction. Thus, for the controller 90 to perform the backup control, more detour routes are able to be selected. Consequently, for example, abnormal locations are able to be detoured around along a shorter route.

In the conveyor system 1 according to the preferred embodiment described above, the backup line 15 is able to be compactly constructed. Thus, even in a place where the inter-level conveyor 8 is provided and space for installation is limited, the backup line 15 is able to be built.

In the conveyor system 1 according to the preferred embodiment described above, only one backup line needs to be installed. Thus, even when the conveyor system is installed over a relatively long distance between buildings, cost increases are able to be significantly reduced or prevented.

Although preferred embodiments of the present invention have been described above, the present invention is not limited to the preferred embodiments described above, and various modifications may be made within the scope not departing from the scope and gist of the present invention.

An example has been described in which the turn conveyors included in the first connecting lines 17 and the second connecting lines 19 according to the preferred embodiment described above are able to convey an article F in both directions of the third direction and the fourth direction. However, the present invention is not limited to this.

Figure 10:
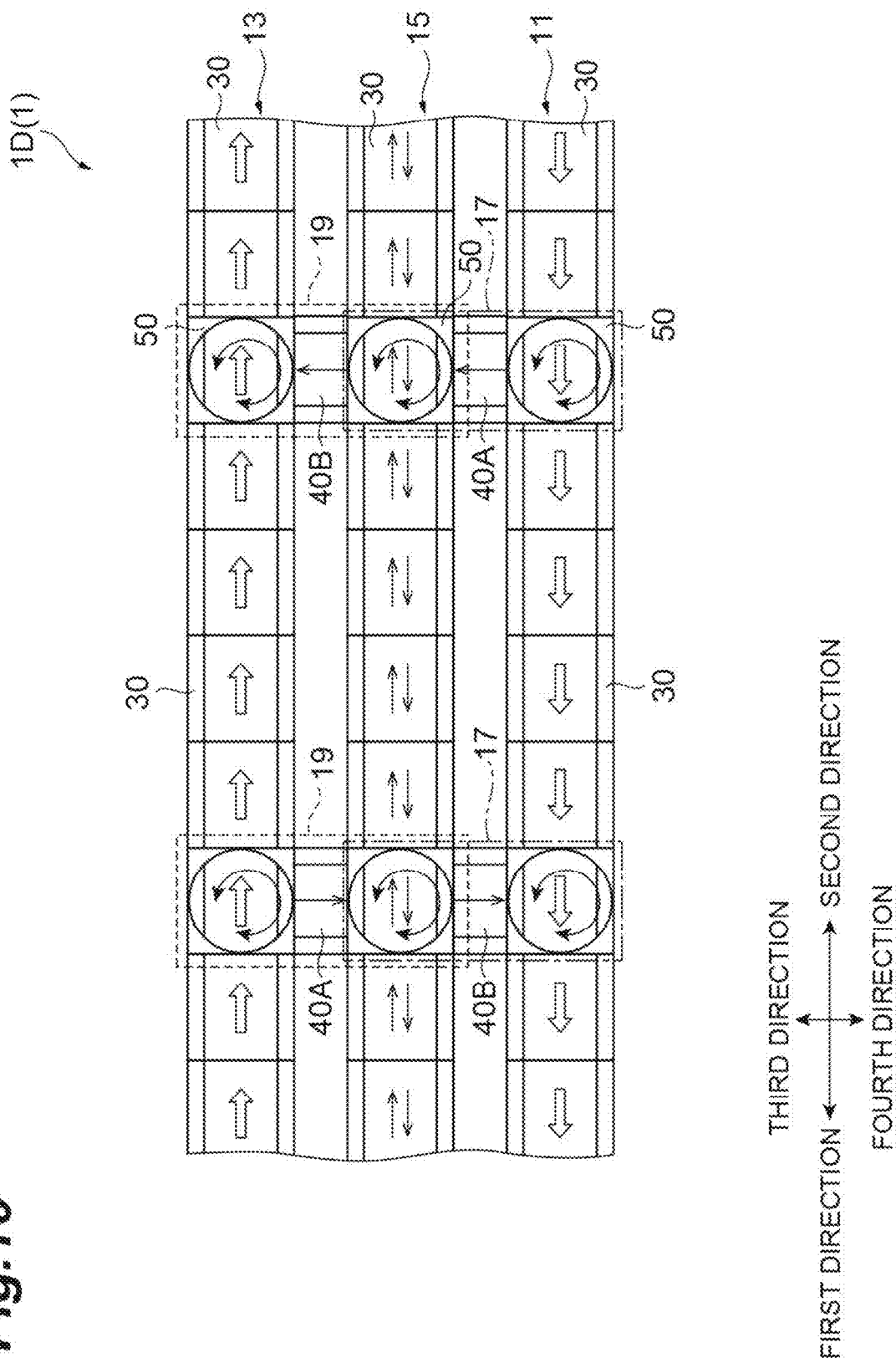
FIG. 10 is a plan view illustrating a portion of a conveyor system according to a modification 1.

For example, as illustrated in FIG. 10, the conveyor system 1 may be implemented as a conveyor system 1D in which the first connecting lines 17 include one or more second conveyors 40A that are each able to convey an article F only in a carry-in direction (third direction) in which the article F is carried in on the backup line 15, and also include one or more second conveyors 40B that are each able to convey an article F only in a carry-out direction (fourth direction) in which the article F is carried out from the backup line 15.

Furthermore, for example, the conveyor system 1 may be implemented as the conveyor system 1D in which the second connecting lines 19 include one or more second conveyors 40A that are each able to convey an article F only in a carry-in direction (fourth direction) in which the article F is carried in on the backup line 15, and also include one or more second conveyors 40B that are each able to convey an article F only in a carry-out direction (third direction) in which the article F is carried out from the backup line 15.

According to this modification 1 also, for example, even if an abnormality has occurred in a first conveyor 30 between a second conveyor 40A and a second conveyor 40B in the first conveyor line 11 (or the second conveyor line 13), the controller 90 is able to perform backup control of detouring around the first conveyor 30 experiencing the abnormality. To perform this backup control, simple control is able to be implemented.

Figure 11:
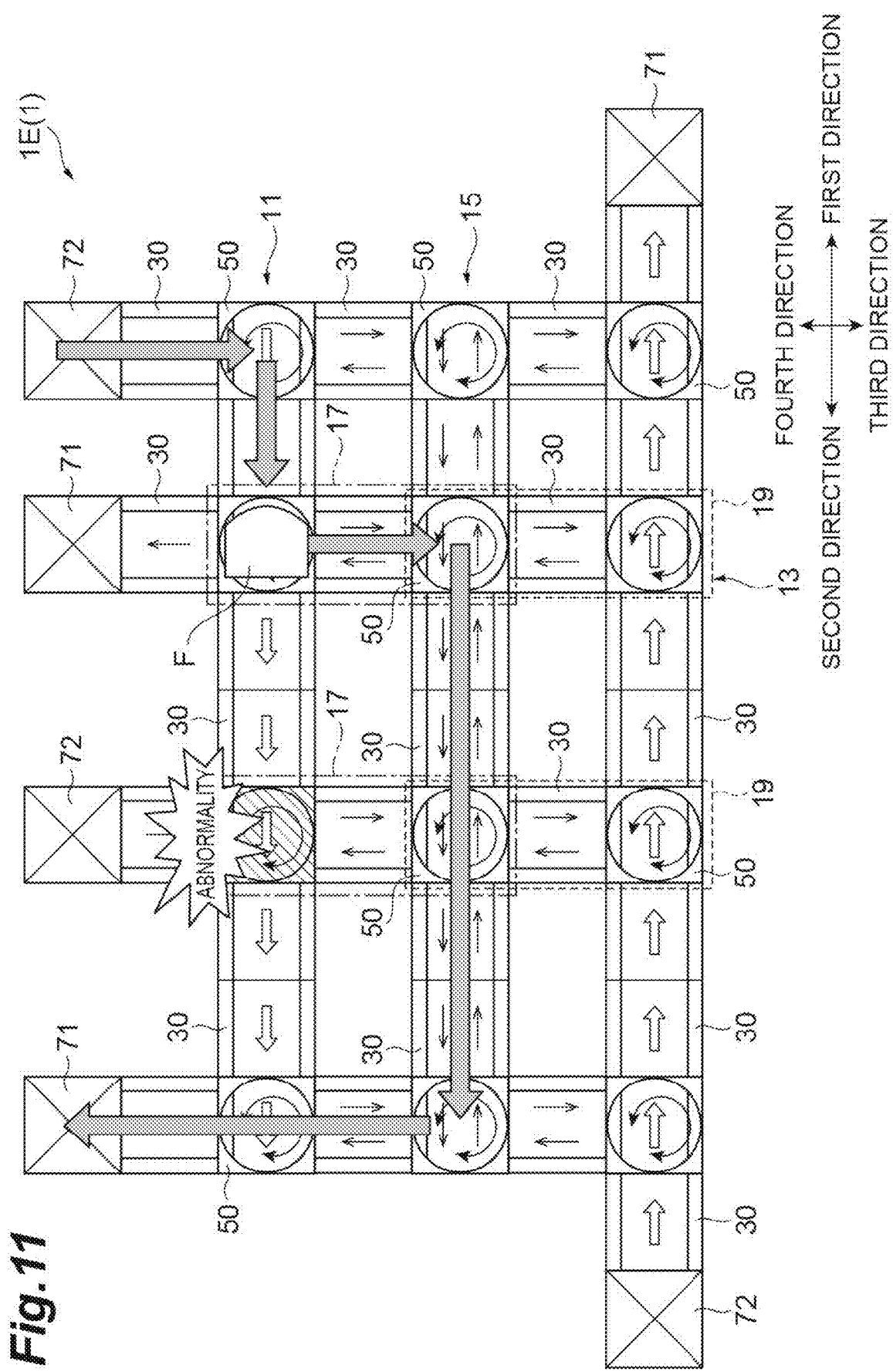
FIG. 11 is a plan view illustrating a portion of a conveyor system according to a modification 2.

An example has been described in which the conveyor system 1 (1A to 1D) according to the preferred embodiment described above is built to be relatively long in the conveyance direction. However, as illustrated in FIG. 11, the conveyor system 1 may be implemented as a conveyor system 1E in which the first conveyor line 11, the second conveyor line 13, the backup line 15, the first connecting lines 17, and the second connecting lines 19 are provided in a grid pattern. Therein, carry-in ports 71 to carry an article F into the conveyor system 1E and carry-out ports 72 to carry an article F out from the conveyor system 1E face the first conveyor line 11 and the second conveyor line 13.

In the preferred embodiment described above, an example has been described in which an abnormality has occurred in a first conveyor 30 included in the first conveyor line 11 and/or the second conveyor line 13. However, the present invention is not limited to this. For example, as illustrated in FIG. 11, if an abnormality has occurred in a turn conveyor 50 (link portion) included in the first conveyor line 11 and/or the second conveyor line 13, an article F may be carried in on the backup line 15 or carried out from the backup line 15 by using two turn conveyors 50, 50 (link portions) adjacent to the turn conveyor 50 in the first direction or the second direction (conveyance direction). Even in this case, the controller 90 retrieves a detour route the starting point and the ending point of which are these turn conveyors 50, 50, and is able to determine the shortest route along which the turn conveyor 50 experiencing the abnormality is able to be detoured around.

In the preferred embodiments or the modifications described above, an example has been described in which, in order to convey an article F in the first direction or the second direction, a plurality of first conveyors 30 are provided. Alternatively, in a portion corresponding to each node portion, one conveyor 3 extending in the conveyance direction may be provided.

In the preferred embodiments or the modifications described above, an example has been described in which the controller 90 and the abnormal-state detector 80 are provided in each of the conveyor systems 1A to 1C. Alternatively, one controller and one abnormal-state detector that may be provided to centrally control the conveyor systems 1A to 1C, or the controller and the abnormal-state detector may be provided in each conveyor.

In the preferred embodiments or the modifications described above, an example has been described in which the backup line 15 is provided between the first conveyor line 11 and the second conveyor line 13. Alternatively, the backup line 15 may be provided outside the first conveyor line 11, or may be provided outside the second conveyor line 13, for example.

In the preferred embodiments or the modifications described above, an example has been described in which each first connecting line 17 and the corresponding second connecting line 19 extend linearly in the width direction perpendicular or substantially perpendicular to the conveyance direction as illustrated in FIG. 2 and FIG. 8 to FIG. 11. Alternatively, the first connecting line 17 and the second connecting line 19 may be displaced in the extending direction thereof (nonlinear in the width direction).

In the preferred embodiments or the modifications described above, an example has been described in which the first connecting lines 17 and the second connecting lines 19 are provided by providing a turn conveyor 50 in a location corresponding to each link portion. However, the present invention is not limited to this. For example, the first connecting lines 17 and the second connecting lines 19 may be implemented by providing pushers to push an article F in the third direction or the fourth direction. In other words, by the pusher, an article F may be carried in on the backup line 15 from the first conveyor line 11 or the second conveyor line 13, or an article F may be carried out therefrom to the first conveyor line 11 or the second conveyor line 13. In this case, the second conveyors 40 defining a portion of each first connecting line 17 and a portion of each second connecting line 19 and illustrated in FIG. 2 may be implemented as roller conveyors having no drive section 46.

While preferred embodiments and modifications of the present invention have been described above, it is to be understood that variations and modifications will be apparent to those skilled in the art without departing from the scope and spirit of the present invention. The scope of the present invention, therefore, is to be determined solely by the following claims.

The invention claimed is:
1. A conveyor system comprising:
conveyors to convey an article while supporting a bottom portion of the article;
a first conveyor line to convey the article only in a first direction;
a second conveyor line parallel or substantially parallel with the first conveyor line to convey the article only in a second direction that is a direction opposite to the first direction;
a backup line parallel or substantially parallel with the first conveyor line and the second conveyor line and able to change states between a state of conveying the article in the first direction and a state of conveying the article in the second direction;
first connecting lines to convey the article between the first conveyor line and the backup line; and
second connecting lines to convey the article between the second conveyor line and the backup line.
2. The conveyor system according to claim 1 further comprising:
a controller to control the conveyors included in each of the first conveyor line, the second conveyor line, the backup line, the first connecting lines, and the second connecting lines; and
an abnormal-state detector to determine that an abnormality is present in at least one of the conveyors included in each of the first conveyor line and the second conveyor line; wherein
the controller starts up at least some of the conveyors included in the backup line from a stationary state, and performs backup control using the first connecting lines, the second connecting lines, and the backup line to convey the article to detour around the at least one of the conveyors experiencing the abnormality, when the abnormal-state detector has determined that the abnormality is present.
3. The conveyor system according to claim 2, wherein, as the conveyor, turning conveyors to convey the article while supporting a bottom portion of the article and to rotate the article about the vertical direction as a rotation axis are provided at connecting portions between the first conveyor line and the first connecting lines, connecting portions between the backup line and the first connecting lines, connecting portions between the second conveyor line and the second connecting lines, and connecting portions between the backup line and the second connecting lines.
4. The conveyor system according to claim 3, wherein the controller inhibits rotation of the turning conveyors at two of the connecting portions respectively, when the article is located on one of the conveyors between two of the connecting portions adjacent to each other.
5. The conveyor system according to claim 2, wherein the controller searches for a shortest path to detour around the at least one of the conveyors experiencing the abnormality, and starts up only conveyors corresponding to the shortest path among the conveyors included in the backup line.
6. The conveyor system according to claim 1, wherein the backup line is located between the first conveyor line and the second conveyor line in a width direction perpendicular or substantially perpendicular to the first direction.
7. The conveyor system according to claim 1, wherein the first connecting lines and the second connecting lines are able to convey the article in both directions of a carry-in direction in which the article is carried into the backup line and a carry-out direction in which the article is carried out from the backup line.
8. The conveyor system according to claim 1, wherein the first conveyor line and the second conveyor line face an inter-level conveyor to convey an article in the vertical direction, and also are connected to a loading-and-unloading conveyor of the inter-level conveyor.
9. The conveyor system according to claim 1 that is between different buildings to connect processing systems in the respective different buildings with each other.
10. The conveyor system according to claim 3, wherein the controller searches for a shortest path to detour around the at least one of the conveyors experiencing the abnormality, and starts up only conveyors corresponding to the shortest path among the conveyors included in the backup line.
11. The conveyor system according to claim 4, wherein the controller searches for a shortest path to detour around the at least one of the conveyors experiencing the abnormality, and starts up only conveyors corresponding to the shortest path among the conveyors included in the backup line.

12. The conveyor system according to claim 2, wherein the backup line is located between the first conveyor line and the second conveyor line in a width direction perpendicular or substantially perpendicular to the first direction.

13. The conveyor system according to claim 3, wherein the backup line is located between the first conveyor line and the second conveyor line in a width direction perpendicular or substantially perpendicular to the first direction.

14. The conveyor system according to claim 4, wherein the backup line is located between the first conveyor line and the second conveyor line in a width direction perpendicular or substantially perpendicular to the first direction.

15. The conveyor system according to claim 5, wherein the backup line is located between the first conveyor line and the second conveyor line in a width direction perpendicular or substantially perpendicular to the first direction.

16. The conveyor system according to claim 10, wherein the backup line is located between the first conveyor line and the second conveyor line in a width direction perpendicular or substantially perpendicular to the first direction.

17. The conveyor system according to claim 11, wherein the backup line is located between the first conveyor line and the second conveyor line in a width direction perpendicular or substantially perpendicular to the first direction.

* * * * *